United States Patent
Flader

(10) Patent No.: US 11,655,139 B2
(45) Date of Patent: May 23, 2023

(54) ACTIVE STICTION RECOVERY

(71) Applicant: InvenSense, Inc., San Jose, CA (US)

(72) Inventor: Ian Flader, Redwood City, CA (US)

(73) Assignee: InvenSense, Inc., San Jose, CA (US)

(*) Notice: Subject to any disclaimer, the term of this patent is extended or adjusted under 35 U.S.C. 154(b) by 227 days.

(21) Appl. No.: 16/946,924

(22) Filed: Jul. 10, 2020

(65) Prior Publication Data

US 2021/0188619 A1 Jun. 24, 2021

Related U.S. Application Data

(60) Provisional application No. 62/953,168, filed on Dec. 23, 2019.

(51) Int. Cl.
*B81B 3/00* (2006.01)
*G01P 15/08* (2006.01)

(52) U.S. Cl.
CPC .......... *B81B 3/001* (2013.01); *G01P 15/0802* (2013.01); *B81B 2203/0163* (2013.01); *B81B 2203/04* (2013.01); *B81B 2207/03* (2013.01); *G01P 2015/0874* (2013.01)

(58) Field of Classification Search
CPC ............ B81B 3/001; B81B 2203/0163; B81B 2203/04; B81B 2207/03; G01P 15/0802; G01P 2015/0874
See application file for complete search history.

(56) References Cited

U.S. PATENT DOCUMENTS 6,621,134 B1 * 9/2003 Zurn .................... B81C 1/00246
    333/197
2013/0106318 A1 * 5/2013 Ikehashi ................ H02N 1/006
    318/116

* cited by examiner

*Primary Examiner* — Benjamin Tzu-Hung Liu

(57) ABSTRACT

A device includes a micro-electromechanical system (MEMS) device layer comprising a proof mass. The proof mass includes a first proof mass portion and a second proof mass portion. The first proof mass portion is configured to move in response to a stimuli. The second proof mass portion has a spring attached thereto. The device further includes a substrate disposed parallel to the MEMS device layer. The substrate comprises a bumpstop configured to limit motion of the first proof mass portion. The device includes a first electrode disposed on the substrate facing the second proof mass portion. The first electrode is configured to apply a pulling force onto the second proof mass portion and to move the second proof mass portion towards the first electrode.

15 Claims, 9 Drawing Sheets

```
┌─────────────────────────────────────────────────────────────┐
│ Detecting that a first proof mass portion of a MEMS device  │
│ layer is stuck to a bumpstop of a CMOS                      │
│ 410                                                         │
└─────────────────────────────────────────────────────────────┘
                              │
┌─────────────────────────────────────────────────────────────┐
│ Applying a first force to a second proof mass portion       │
│ 420                                                         │
└─────────────────────────────────────────────────────────────┘
                              │
┌─────────────────────────────────────────────────────────────┐
│ Optionally applying a second force to a third proof mass    │
│ portion                                                     │
│ 430                                                         │
└─────────────────────────────────────────────────────────────┘
                              │
┌─────────────────────────────────────────────────────────────┐
│ Terminating the application of force (first or second or    │
│ both)                                                       │
│ 440                                                         │
└─────────────────────────────────────────────────────────────┘
```

FIGURE 4

ACTIVE STICTION RECOVERY

CROSS-REFERENCE TO RELATED APPLICATIONS

This application claims the benefit and priority to the U.S. Provisional Patent Application Ser. No. 62/953,168 filed Dec. 23, 2019, entitled "Active Stiction Recovery," which is incorporated herein by reference in its entirety.

BACKGROUND

MEMS ("micro-electro-mechanical systems") are a class of devices that are fabricated using semiconductor-like processes and exhibit mechanical characteristics. For example, MEMS devices may include the ability to move or deform. Large movement of the MEMS device may cause portions of the MEMS device to stick to ne other or a substrate without releasing. In other words, stiction results in large surface adhesion since the restoring force cannot overcome the attractive interfacial forces caused by capillary and electrostatic forces. Stiction can occur during fabrication and/or in applications (in-use stiction). The surface adhesion and stiction adversely affect the reliability and long-term durability of MEMS devices.

SUMMARY

Accordingly, a need has arisen to recover from stiction in MEMS devices. Methods and systems to recover from stiction between two devices, e.g., MEMS and silicon substrate, etc., are disclosed. It is appreciated that one portion of a proof mass (e.g., used for sensing movement responsive to a stimuli) of a MEMS device may stick to a bumpstop disposed on the silicon substrate. In some embodiments, one or more electrodes (non-sensing electrodes) disposed on a silicon substrate may be used to apply a pulling force, e.g., via an electrostatic force, to a proof mass portion (that is not stuck to the bumpstop), thereby pulling that proof mass portion. The proof mass portion that is being pulled includes a stiction recovery spring that compresses and bends, thereby storing energy. Once the application of the pulling force is stopped, the stiction recovery spring releases the energy stored thereon causing the proof mass portion that is not stuck to the bumpstop to spring back toward the MEMS device, and as a result pulling the proof mass portion that is stuck to the bumpstop with it. Thus, the device recovers from stiction.

In some embodiments, a device includes a MEMS device layer comprising a proof mass. The proof mass includes a first proof mass portion and a second proof mass portion. The first proof mass portion is configured to move in response to a stimuli. The second proof mass portion is coupled to the first proof mass portion by a spring. The device further includes a substrate disposed opposite the MEMS device layer. The substrate comprises a bumpstop configured to limit motion of the first proof mass portion. The device includes a first electrode disposed on the substrate facing the second proof mass portion. The first electrode is configured to apply a pulling force onto the second proof mass portion and to move the second proof mass portion towards the first electrode.

In some embodiments, the first electrode is further configured to subsequently stop applying the pulling force and the spring is configured to release the energy stored in the spring responsive to the stopping of the application of the pulling force. It is appreciated that the energy released generates a force that is greater than a stiction force resulting from the first proof mass portion contacting the bumpstop.

It is appreciated that the substrate may include a charge pump configured to apply electrostatic charge through the first electrode to apply the pulling force to the second proof mass portion. It is appreciated that in some embodiments, the MEMS device layer further includes a third proof mass portion coupled to the first proof portion by another spring. It is further appreciated that the substrate may further include a second electrode disposed under the third proof mass portion configured to apply another pulling force to the third proof mass portion. According to some embodiments, the energy released from the spring and the another spring generates a force that is greater than a stiction force resulting from the first proof mass portion sticking to the bumpstop.

It is appreciated that the spring may have a spring constant that is different from the another spring. Moreover, in some embodiments the another pulling force is different from the pulling force. It is appreciated that a spring constant of the spring may be the same as a spring constant of the another spring. It is further appreciated that in some embodiments the another pulling force is a same as the pulling force.

In some embodiments, a method includes detecting that a first proof mass portion of a MEMS device layer has stuck to a bumpstop disposed on a substrate. Responsive to the detecting, the method may further include applying a force to a second proof mass portion of the MEMS device layer wherein the applying pulls the second proof mass portion of the MEMS device layer toward the substrate. The second proof mass portion includes a spring and the second proof mass portion becomes in contact with the substrate responsive to the application of the force. It is appreciated that the application of the force stores energy in the spring. Subsequent to the application of the force, the method may further include terminating the application of the force. The terminating releases the energy stored in the spring. The force generated by the release of the energy stored in the spring is greater than a force causing the first proof mass portion to stick to the bumpstop of the substrate.

It is appreciated that the method may further include sensing movement responsive to a stimuli, using the first proof mass portion. According to some embodiments, the bumpstop is configured to stop the first proof mass portion from making contact with other components on the substrate. In one nonlimiting embodiment, the application the force is via application of electrostatic charges.

The method may further include, applying another force to a third proof mass portion of the MEMS device layer in response to the detecting. The applying the another force pulls the third proof mass portion of the MEMS device layer toward the substrate. The third proof mass portion comprises another spring and the third proof mass portion becomes in contact with the substrate responsive to the application of the another force. The application of the another force stores energy in the another spring. The method may further include terminating the application of the another force subsequent to the application of the another force. The terminating the application of the another force releases the energy stored in the another spring. It is appreciated that a force generated by the release of the energy stored in the another spring and the energy stored in the spring are greater than a force causing the first proof mass portion to stick to the bumpstop of the substrate. According to some embodiments, the force generated by the release of the energy stored in the another spring is different from the force generated by the release of the energy stored in the spring.

These and other features and aspects of the concepts described herein may be better understood with reference to the following drawings, description, and appended claims.

BRIEF DESCRIPTION OF DRAWINGS

FIG. 4 shows a method of recovery from stiction according to one aspect of the present embodiments.

DESCRIPTION

Figure 1A:
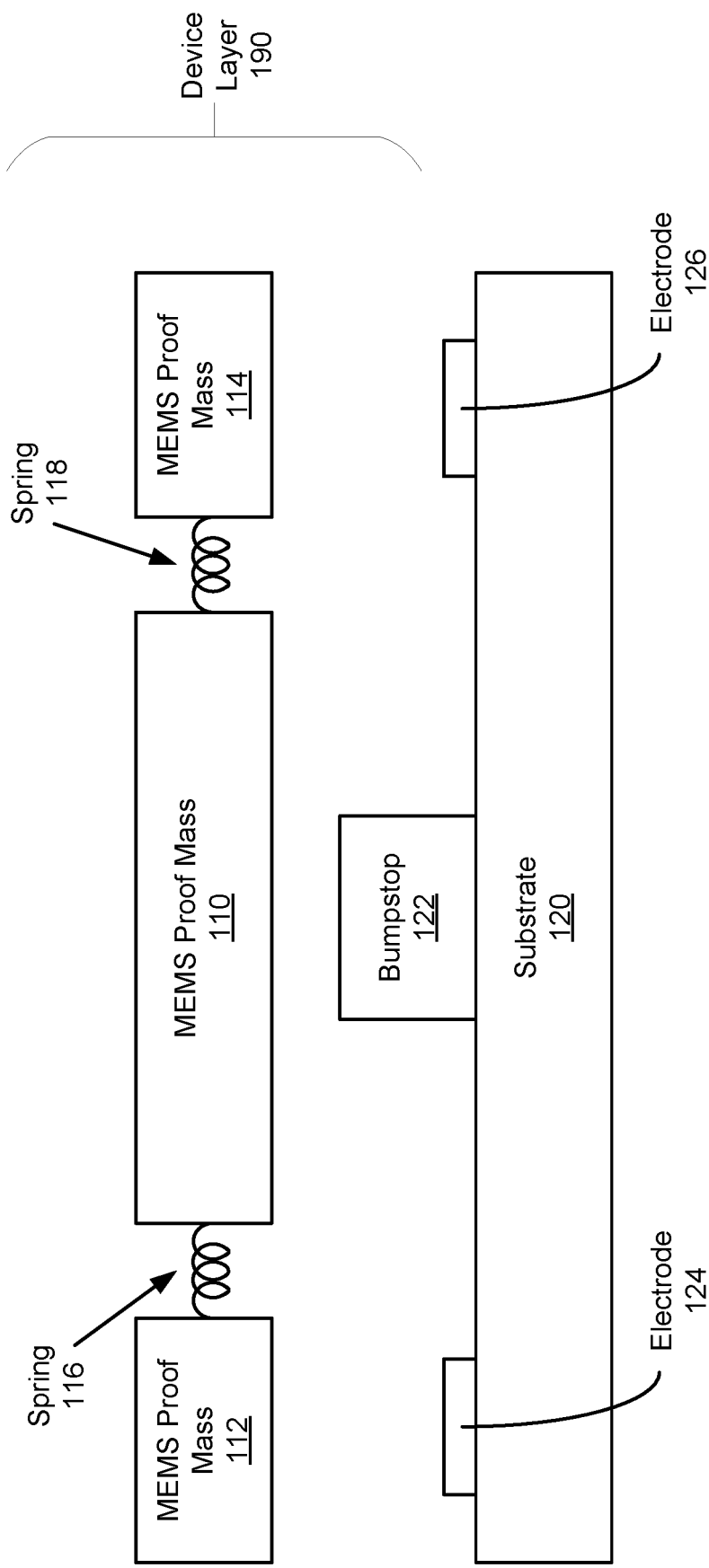
FIG. 1A shows a MEMS device and a substrate prior to stiction according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," "forming," "formation," "reducing," "applying," "pulling," "terminating," "detecting," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Stiction is an issue in MEMS devices, and there exists a need to reduce MEMS failure due to stiction. It is appreciated that the proof mass of a MEMS device may include a first proof mass portion and a second proof mass portion. The first proof mass portion may include a sensing electrode that is configured to sense movement in response to a stimuli, e.g., pressure, acceleration, rotation, etc. It is appreciated that the second proof mass portion is coupled to the first proof mass portion by a spring. The substrate may include a bumpstop formed thereon. As such, the bumpstop prevents the first proof mass portion from contacting other components on the substrate. However, when adhesion force between the first proof mass portion and the bumpstop exceeds a certain threshold, the two components stick to one another causing stiction. When stiction occurs, an electrostatic charge is applied to a non-sensing electrode of the substrate and therefore pulls the second proof mass portion towards the substrate, causing the spring to decompress and bend toward the substrate. As such, energy is stored in the spring. It is appreciated that the electrostatic charge is large enough to decompress the spring to a certain threshold to generate enough energy that once released generates a force greater than the adhesion force causing stiction. It is appreciated that subsequent to application of the electrostatic charge and decompressing the spring, the electrostatic charge is removed causing the stored energy in the spring to be released. The force generated by the release of the energy causes the second proof mass portion to catapult away from the substrate and toward the MEMS device, thus overcoming the adhesion force between the first proof mass portion and the bumpstop. Accordingly, the first proof mass portion separates from the bumpstop and the device recovers from stiction.

Referring now to FIG. 1A, a MEMS device and a substrate prior to stiction according to one aspect of the present embodiments is shown. A device layer 190 may include a proof mass 110, 112, and 114, as an example. It is appreciated that the proof mass 110 may be coupled to an anchor that moves in response to a stimuli, e.g., acceleration, pressure, rotation, etc., thereby moving the proof mass 110. In some embodiments, the layer device 190 may also include MEMS proof mass portions 112 and 114. The proof mass portions 112 and 114 may each include a spring 116 and 118, respectively attaching the proof mass portion 112 and 114 to the proof mass portion 110. It is appreciated that even though only one spring per proof mass 112 and 114 is shown, any number of springs may be used and discussion with respect to one spring is for illustrative purposes and should not be construed as limiting the scope of the embodiments. Furthermore, it is appreciated that discussion with respect to two proof mass portions having springs is for illustrative purposes and should not be construed as limiting the scope of the embodiments and that any number of proof mass portions with spring may be used. In some embodiments, the springs 116 and 118 have the same spring constant whereas in other embodiments the spring constants may be different from one another. In the illustrated embodiment, the spring constants of the springs 116 and 118 are the same.

It is appreciated that the substrate 120 may be a complementary metal-oxide-semiconductor (CMOS) and it may include a bumpstop 122 formed thereon. The bumpstop 122 is configured to prevent the proof mass 110 from contacting other components on the substrate 120 and damaging those components. According to one embodiment, the electrode 124 is disposed on a surface of the substrate 120 that faces the spring 116 of the MEMS proof mass 112. Similarly, the electrode 126 is disposed on a surface of the substrate 120 that faces the spring 118 of the MEMS proof mass 114.

It is appreciated that the device layer 190 structure may be patterned lithographically and etched. The device layer 190 geometry includes springs 114 and 116 and defined within the structures. It is appreciated that the geometry of the MEMS structures as shown is for illustrative purposes and should not be construed as limiting the scope of the embodiments.

Figure 1B:
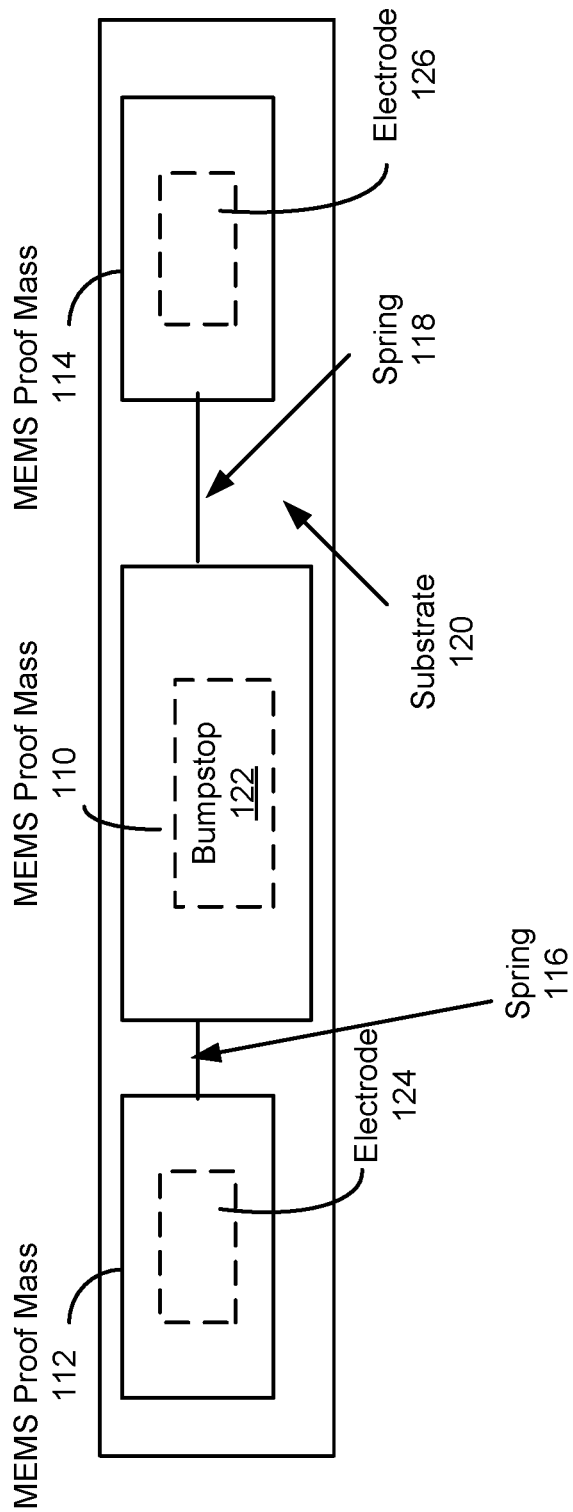
FIG. 1B shows a top view of a MEMS device and a substrate according to one aspect of the present embodiments.

Referring now to FIG. 1B, a top view of a MEMS device and a substrate according to one aspect of the present embodiments is shown. It is appreciated that shape and the structure of the MEMS and the positioning of the springs and the electrodes are for illustrative purposes and should not be construed as limiting the scope of the embodiments.

Figure 1C:
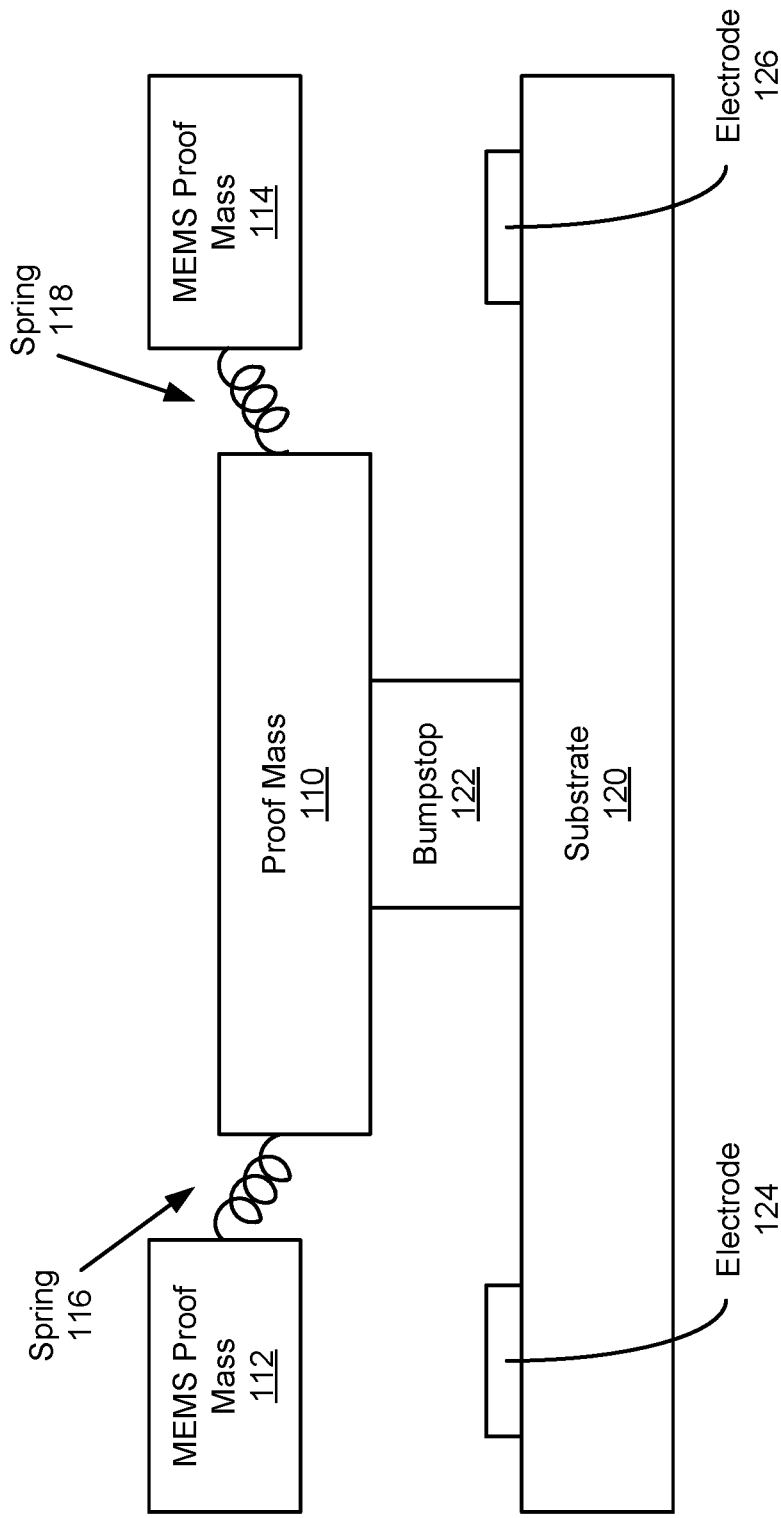
FIG. 1C shows a MEMS device and a substrate during stiction according to one aspect of the present embodiments.

Referring now to FIG. 1C, a MEMS device and a substrate during stiction according to one aspect of the present embodiments is shown. FIG. 1C is substantially similar to that of FIG. 1A. In this embodiment, the MEMS proof mass 110 becomes in contact with the bumpstop 122 of the substrate 120. The adhesion force between the MEMS proof mass 110 and the bumpstop 122 is large enough to cause the two surfaces to stick to one another and not release, causing stiction. It is appreciated that in this embodiment, the MEMS proof mass 112 and 114 remain in the same position as in FIG. 1A or move a little toward the substrate 120 but not as much as the proof mass 110 and without making contact with the substrate 120.

Figure 1D:
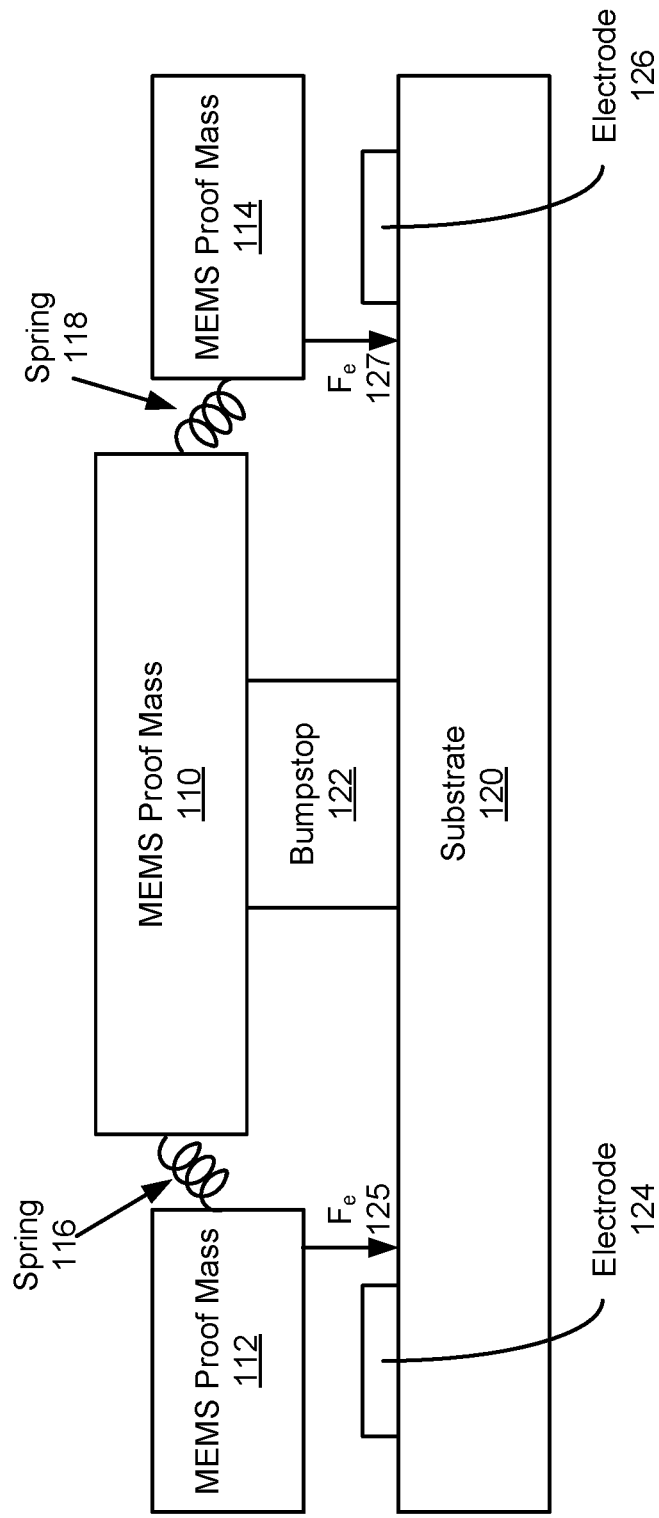
FIGS. 1D-1E show a MEMS device and a substrate during stiction recovery mode according to one aspect of the present embodiments.
Figure 1E:
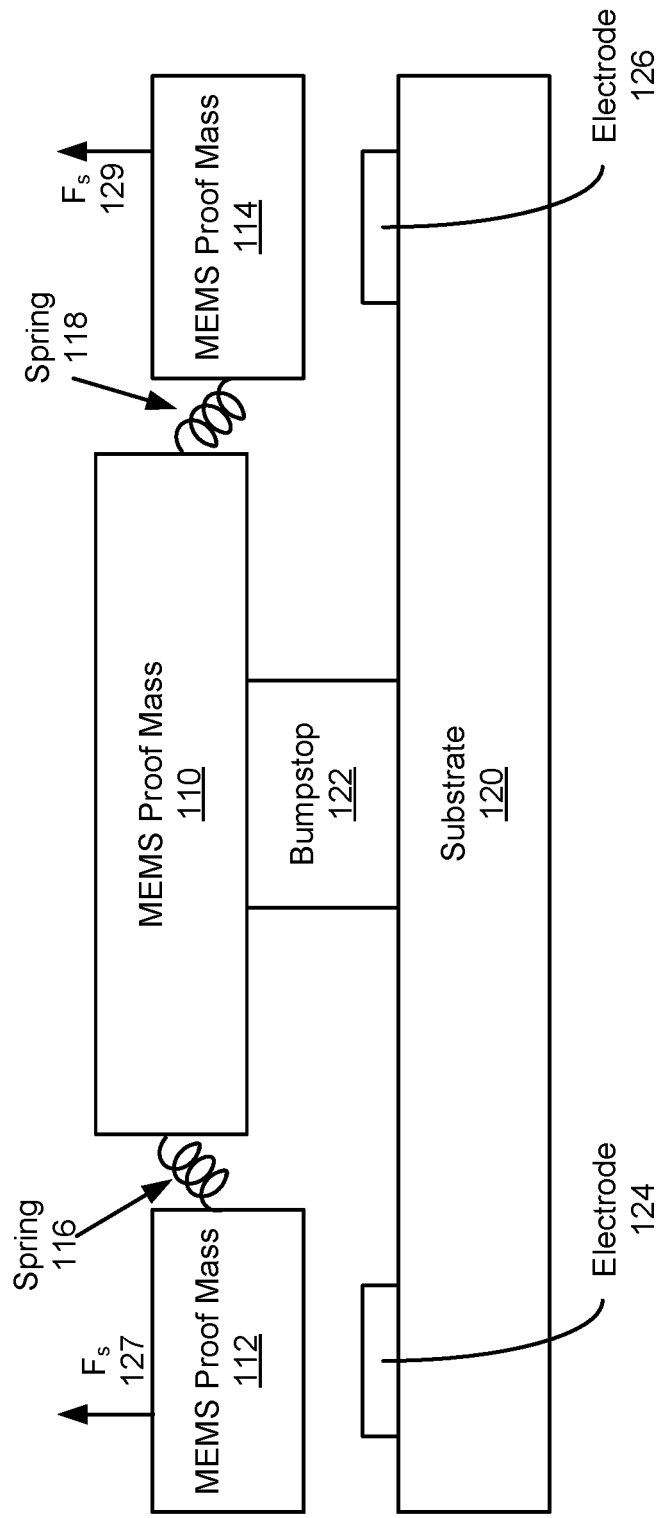

Referring now to FIGS. 1D-1E, a MEMS device and a substrate during stiction recovery mode according to one aspect of the present embodiments are shown. Once stiction is detected, more particularly in FIG. 1D, an electrostatic charge is applied using electrodes 124 and 126. In some embodiments, the electrostatic charge is supplied through a charge pump from the substrate 120. It is appreciated that the electrostatic charge may create a voltage within 5-20 volts. The electrostatic charge applied through the electrode 124 generates a force $F_e$ 125 that pulls the MEMS proof mass 112. Similarly, the electrostatic charge applied through the electrode 126 generates a force $F_e$ 127 that pulls the MEMS proof mass 114. It is appreciated that in some embodiments, the electrostatic charge applied through the electrodes 124 and 126 may differ from one another causing different pull forces to be applied to the MEMS proof mass 112 and the MEMS proof mass 114. The pull forces in this embodiment is the same and causes the spring 116 and the spring 118 to deflect or compress in the same fashion, therefore storing the same amount of energy. It is appreciated that in some nonlimiting embodiments, the MEMS proof mass 112 and 114 may be pulled until they become in contact with the substrate 120.

FIG. 1E is substantially similar to that of FIG. 1D except that in this embodiment, the application of electrostatic charge through the electrodes 124 and 126 is terminated. As such, the energy stored in the springs 116 and 118 is released and generate a restoring forces $F_s$ 127 and $F_s$ 129, respectively. The restoring forces $F_s$ 127 and $F_s$ 129 catapult the MEMS proof mass 112 and 114 respectively away from the substrate 120 and toward their original position as shown in FIG. 1A. It is appreciated that the restoring forces $F_s$ 127 and $F_s$ 129 is greater than the adhesion force between the MEMS proof mass 110 and the bumpstop 122 when stuck during stiction. As such, the catapult of the MEMS proof mass 112 and 114 also pull the MEMS proof mass 110 causing it to separate from the bumpstop 122. As such, the MEMS proof mass 110 is released and the device is recovered from stiction mode. The MEMS proof mass 110 recovered from the stiction mode is illustrated in FIG. 1A.

Figure 2:
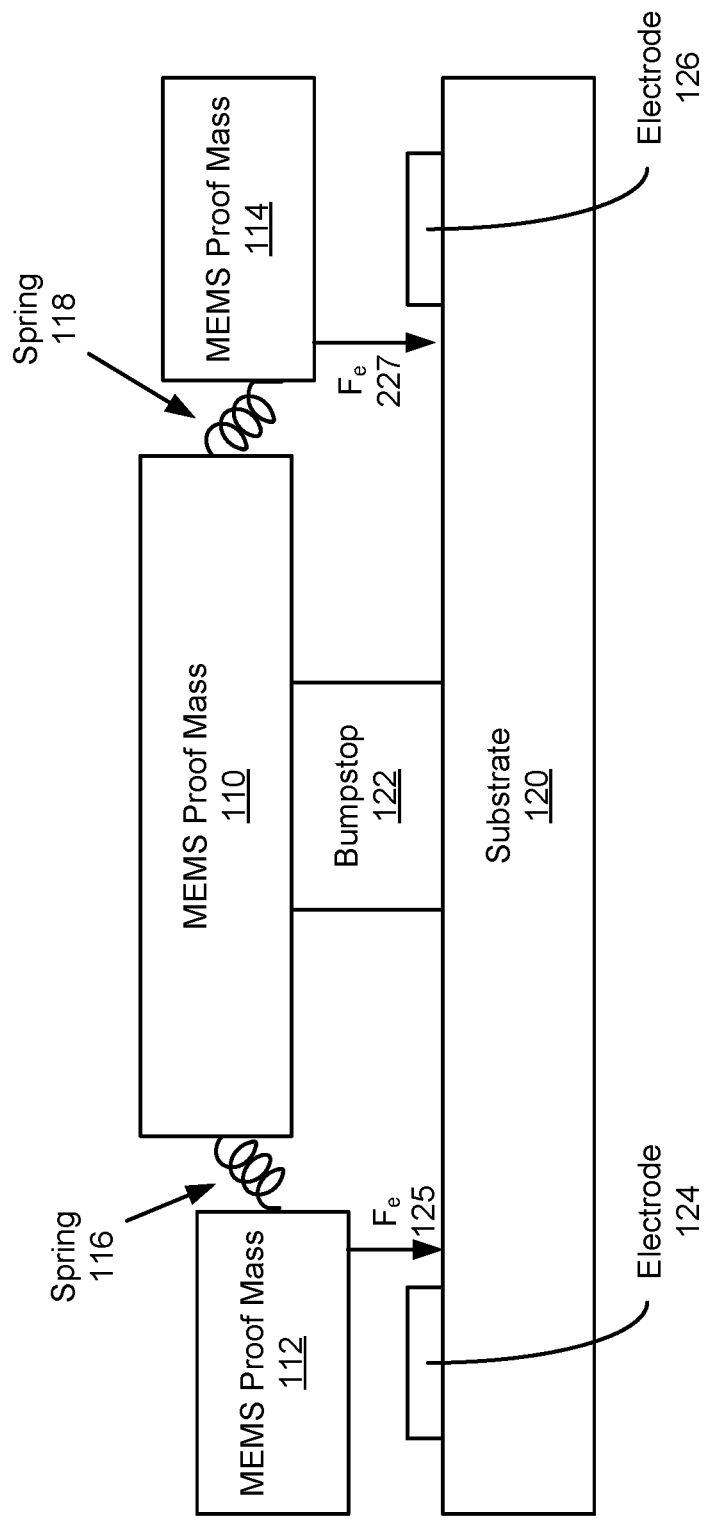
FIG. 2 shows a MEMS device and a substrate during stiction recovery mode according to another aspect of the present embodiments.

Referring now to FIG. 2, a MEMS device and a substrate during stiction recovery mode according to another aspect of the present embodiments is shown. FIG. 2 is substantially similar to that of FIG. 1D. However, in this embodiment, the electrostatic charge being applied by the electrode 126 is different from the electrostatic charge being applied by the electrode 124, thereby generating a different pull force $F_e$ 227 on the MEMS proof mass 114 in comparison to the MEMS proof mass 112. Accordingly, the spring 118 deflects differently from that of the spring 116, thereby storing a different amount of energy in the spring 118 and therefore generating a different restoring force once released. Since the spring 116 stores more energy in comparison to the spring 118, once application of the electrostatic charge is terminated, the spring 116 catapults the MEMS proof mass 112 in an uneven fashion in comparison to the spring 118 catapulting the MEMS proof mass 114 (assuming MEMS proof mass 112 has a similar shape and structure as that of MEMS proof mass 114) when their respective stored energy are released.

It is appreciated that in some embodiments, the spring 118 may have a different spring constant from that of spring 116. As such, when the electrodes 124 and 126 apply the pull forces $F_e$ 125 and $F_e$ 227 that are equal to one another, the springs 116 and 118 deflect differently from one another. In other words, each spring stores a different amount of energy. As such, when the application of electrostatic charge is terminated, each spring releases a different amount of energy and therefore uneven forces are generated.

It is appreciated that use of springs 116 and 118 with different spring constants results in an uneven amount of electrostatic charge being applied through electrodes 124 and 126. Accordingly, different pull forces $F_e$ 125 and 227. Accordingly, assuming that the MEMS proof mass 112 and 114 have similar shape and structure, the springs 118 and 116 store different amounts of energy and therefore once released, and therefore generate uneven forces.

Figure 3:
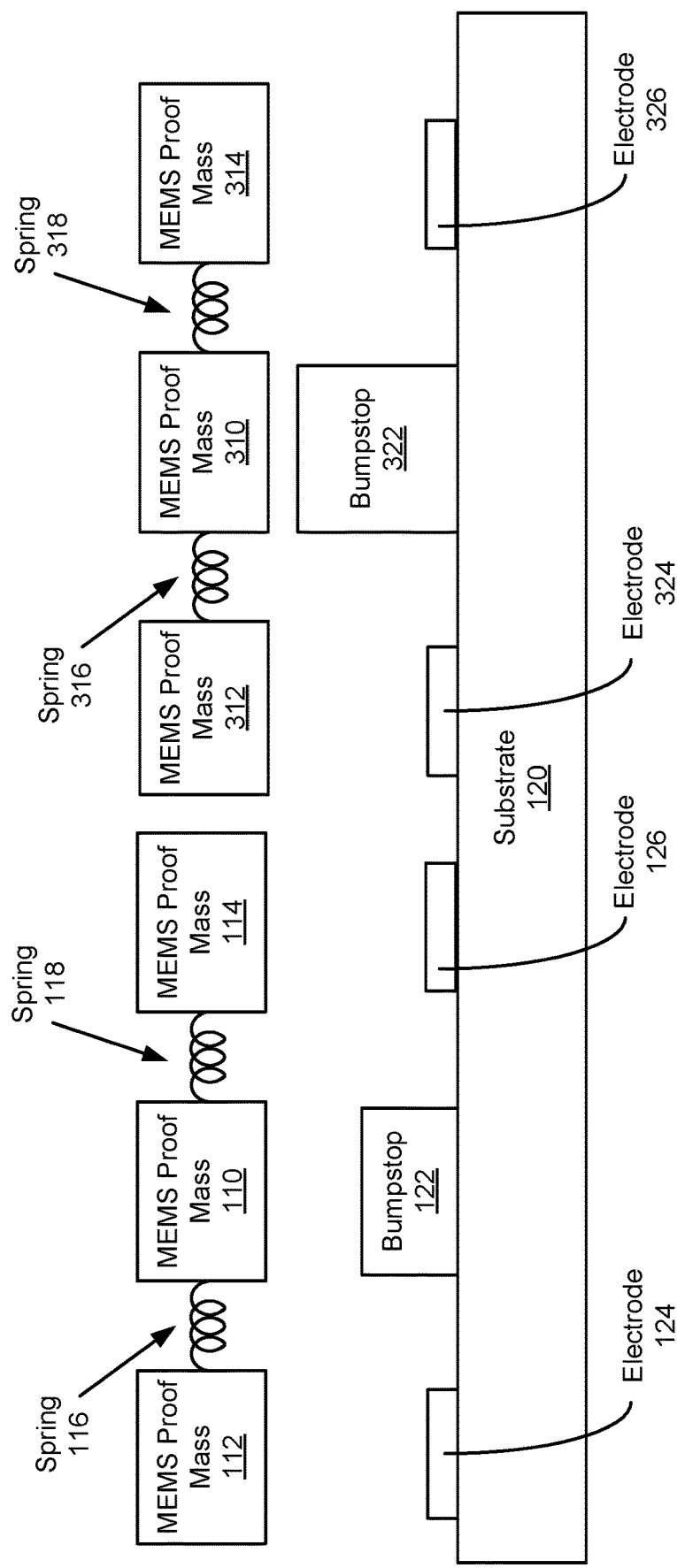
FIG. 3 shows a MEMS device and a substrate with a set of stiction recovery mode according to some embodiments.

Referring now to FIG. 3, a MEMS device and a substrate with a set of stiction recovery mode according to some embodiments. It is appreciated that the MEMS device may include multiple MEMS proof mass and multiple bumpstops with different spring constants, different bumpstop heights, etc.

In this embodiment, the device includes the MEMS proof mass 110, 112, 114 connected to one another via springs 116 and 118, and a bumpstop 122 configured to stop the MEMS proof mass 110 from making contact with the substrate 120. Moreover, as described above, the electrodes 124 and 126 are used to apply a force onto the MEMS proof mass 112 and 114 respectively, e.g., electrostatic charge that pulls the MEMS proof mass 112 and 114 toward the substrate 120, during stiction, storing energy therein. Accordingly, when the application of electrostatic charge is stopped, the energy stored in the springs 116 and 118 is released and catapult the MEMS proof mass 112 and 114 therefore pulling the MEMS proof mass 110 away from the bumpstop 122, thereby releasing it from stiction. The device may further include other proof mass 310, 312, 314 connected to one another via springs 316 and 318, and a bumpstop 322 configured to stop the MEMS proof mass 310 from making contact with the substrate 120. It is appreciated that the proof mass 310, 312, 314, the springs 316 and 318, and the bumpstop 322 operate substantially similar to that of proof mass 110, 112, 114, springs 116, 118, and the bumpstop 122. It is appreciated that the bumpstops 122 and 322 may have a different shape from one another, e.g., height may be different. In other embodiments, the shape of the bumpstops may differ from one another. The electrodes 324 and 326 operate substantially similar to that of 124 and 126. For example, the electrodes 324 and 326 are used to apply a force onto the MEMS proof mass 312 and 314 respectively, e.g., electrostatic charge that pulls the MEMS proof mass 312 and 314 toward the substrate 120, during stiction, storing energy therein. Accordingly, when the application of electrostatic charge is stopped, the energy stored in the springs 316 and 318 is released and catapult the MEMS proof mass 312 and 314 therefore pulling the MEMS proof mass 310 away from the bumpstop 322, thereby releasing it from stiction.

Referring now to FIG. 4, a method of recovery from stiction according to one aspect of the present embodiments is shown. At step 410, it is detected that a first proof mass portion of a MEMS device is stuck to a bumpstop of a substrate. In some embodiments, the device may be determined to be in a stuck state by a pull-in test or in response to the same reading for different stimuli. At step 420, a first force is applied to a second proof mass portion of the MEMS device responsive to detecting that the first proof mass portion is stuck to the bumpstop. The applied first force pulls the second proof mass portion of the MEMS device toward the substrate, as described in FIGS. 1D, and 2-3. It is appreciated that the second proof mass portion that includes a first spring and is pulled toward the substrate responsive to the application of the force. Accordingly, the first spring stores energy resulting from the first pull force, as described above. Optionally at step 430, a second force is applied to a third proof mass portion of the MEMS device. The second force pulls the third proof mass portion of the MEMS device toward the substrate, as described in FIGS. 1D, and 2-3. It is appreciated that the third proof mass portion that includes a second spring and is pulled toward the substrate responsive to the application of the second force. Accordingly, the second spring stores energy resulting from the second pull force, as described above.

Subsequently, at step 440, the application of the force (first or second or both) is terminated, thereby releasing the energy stored in the stiction recovery spring (first or second or both), as described in FIG. 1E. The force generated by the release of the energy stored in the spring(s) is greater than a force causing the first proof mass portion to stick to the bumpstop of the substrate, separating the first proof mass portion from the bumpstop. It is appreciated that in some embodiments, the force generated by the release of the energy stored in the second spring is different from the force generated by the release of the energy stored in the first spring. Accordingly, a mechanism to recover from stiction is provided.

Figure 5:
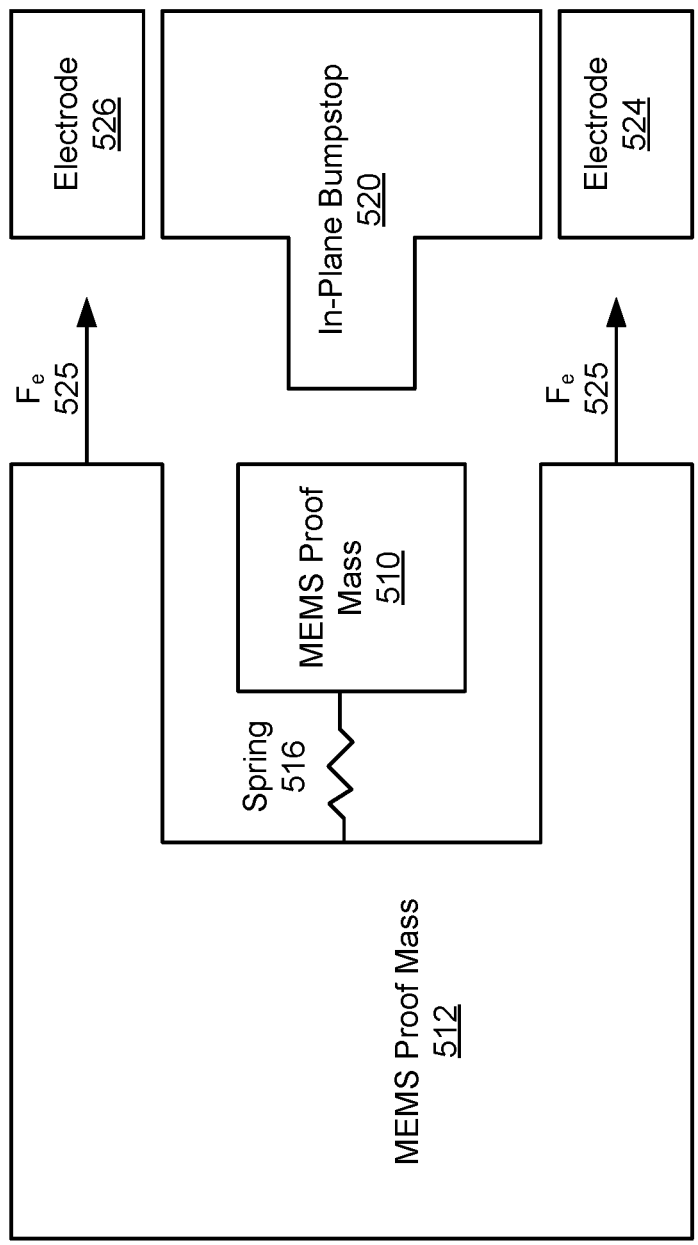
FIG. 5 shows a MEMS device and a substrate with a set of in-plane stiction recovery mode according to some embodiments.

Referring now to FIG. 5, a MEMS device and a substrate with a set of in-plane stiction recovery mode according to some embodiments is shown. In this embodiment, stiction recovery is provided for in-plane motion. In this example, the MEMS proof mass 512 is coupled to the MEMS proof mass 510 via a spring 516. The MEMS proof mass 510 becomes in contact with the in-plane bumpstop 520 and does not release when stiction occurs. Accordingly, the electrodes 526 and 524 may be used to apply electrostatic force $F_e$ 525 to the MEMS proof mass 512 and to pull the MEMS proof mass 512 toward the electrodes 524 and 526. As such, energy is stored in the spring 516. Once the application of the electrostatic force is terminated the stored energy in the spring 516 is released catapulting the MEMS proof mass 512 and as a result MEMS proof mass 510 away from the in-plane bumpstop 520.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above, and other implementations are within the scope of the following claims.

What is claimed is:

1. A device comprising:
a micro-electromechanical system (MEMS) device layer comprising a proof mass, wherein the proof mass comprises a first proof mass portion, a second proof mass portion, and a third proof mass portion, and wherein the first proof mass portion configured to move in response to a stimuli, and wherein the second proof mass portion is coupled to the first proof mass by a spring, and wherein the third proof mass portion is coupled to the first proof mass portion by another spring, wherein the spring has a spring constant that is different from the another spring;
a substrate disposed opposite to the MEMS device layer, wherein the substrate comprises a bumpstop configured to limit motion of the first proof mass portion;
a first electrode disposed on the substrate facing the second proof mass portion, wherein the first electrode is configured to apply a pulling force onto the second proof mass portion and to move the second proof mass portion towards the first electrode; and
a second electrode disposed under the third proof mass portion configured to apply another pulling force to the third proof mass portion,
wherein the first electrode is further configured to subsequently stop applying the pulling force and wherein the spring is configured to release the energy stored in the spring responsive to the stopping of the application of the pulling force, wherein the energy released generates a force that is greater than a stiction force resulting from the first proof mass portion contacting the bumpstop.

2. The device of claim 1, wherein the substrate comprises MEMS device layer.

3. The device of claim 1, wherein the substrate comprises a charge pump configured to apply electrostatic charge through the first electrode.

4. The device of claim 1, wherein the energy released from the spring and the another spring generates a force that is greater than a stiction force resulting from the first proof mass portion sticking to the bumpstop.

5. The device of claim 1, the applying the pulling force comprises applying an electrostatic charge to the first electrode to store energy in the spring.

6. The device of claim 1, wherein the another pulling force is different from the pulling force.

7. The device of claim 1, wherein a spring constant of the spring is a same as a spring constant of the another spring.

8. The device of claim 1, wherein the another pulling force is a same as the pulling force.

9. A method comprising:
    detecting that a first proof mass portion of a microelectromechanical system (MEMS) device layer has stuck to a bumpstop disposed on a substrate;
    responsive to the detecting, applying a force to a second proof mass portion of the MEMS device layer wherein the applying pulls the second proof mass portion of the MEMS device layer toward the substrate,
    wherein the second proof mass portion is coupled to the first proof mass portion by a spring and
    wherein the application of the force stores energy in the spring; and
    subsequent to the application of the force, terminating the application of the force, wherein the terminating releases the energy stored in the spring and wherein a force generated by the release of the energy stored in the spring is greater than a force causing the first proof mass portion to stick to the bumpstop of the substrate.

10. The method of claim 9 further comprising sensing movement responsive to a stimuli, using the first proof mass portion.

11. The method of claim 9, wherein the bumpstop is configured to stop the first proof mass portion from making contact with other components on the substrate.

12. The method of claim 9, wherein the application the force is via application of electrostatic charges.

13. The method of claim 9 further comprising:
    responsive to the detecting, applying another force to a third proof mass portion of the MEMS device layer wherein the applying the another force pulls the third proof mass portion of the MEMS device layer toward the substrate, wherein the third proof mass portion comprises another spring and wherein the third proof mass portion becomes in contact with the substrate responsive to the application of the another force and wherein the application of the another force stores energy in the another spring.

14. The method of claim 13 further comprising:
    subsequent to the application of the another force, terminating the application of the another force, wherein the terminating the application of the another force releases the energy stored in the another spring and wherein a force generated by the release of the energy stored in the another spring and the energy stored in the spring are greater than a force causing the first proof mass portion to stick to the bumpstop of the substrate.

15. The method of claim 14, wherein the force generated by the release of the energy stored in the another spring is different from the force generated by the release of the energy stored in the spring.

* * * * *